United States Patent [19]

Mulvanny et al.

[11] 4,415,921
[45] Nov. 15, 1983

[54] AUTOMATIC CALIBRATION SYSTEM FOR VIDEO DISPLAYS IN VISION TESTING

[75] Inventors: Patrick Mulvanny, Evanston; Scott Bartky, Chicago, both of Ill.

[73] Assignee: Nicolet Instrument Corporation, Madison, Wis.

[21] Appl. No.: 316,737

[22] Filed: Oct. 30, 1981

[51] Int. Cl.³ .............................................. H04N 7/02
[52] U.S. Cl. ...................................... 358/139; 358/10; 358/168
[58] Field of Search ................... 358/139, 10, 168, 169

[56] References Cited

U.S. PATENT DOCUMENTS

| | | | |
|---|---|---|---|
| 3,574,450 | 4/1971 | White et al. | 351/17 |
| 3,705,003 | 7/1970 | Lynn et al. | 351/246 |
| 3,737,217 | 6/1973 | Haines et al. | 351/23 |
| 3,861,790 | 1/1975 | Tamura | 351/17 |
| 3,910,690 | 10/1975 | Regan | 351/31 |
| 3,936,162 | 2/1976 | Krakau et al. | 351/17 |
| 4,012,128 | 3/1977 | Regan | 351/17 |
| 4,070,102 | 1/1978 | Lelouch | 351/17 |
| 4,155,632 | 5/1979 | Wolbarsht | 351/36 |

FOREIGN PATENT DOCUMENTS 54-23322  2/1979  Japan ........................ 358/168

Primary Examiner—Richard Murray
Attorney, Agent, or Firm—Kinney, Lange, Braddock, Westman & Fairbairn

[57] ABSTRACT

A calibration circuit and method for instructing an instrument operator on how to adjust the brightness and contrast controls of a video display in order to achieve a precise display intensity directly proportional to the video drive signal input to the video display. A photometer detects the display intensity as the video drive is modulated and a differential amplifier compares the video drive to the photometer output signal thereby generating an analog offset signal highly representative of brightness and contrast offsets. The analog offset signal is converted to numerical offset values from which independent brightness and contrast offsets are computed. For raster-scanned video displays only a one-bit analog-to-digital converter, a comparator, is required and a multi-bit numerical value of the video offset may be obtained from the comparator output by the method of counting the number of scan lines in each frame giving a positive comparator output.

17 Claims, 14 Drawing Figures

AUTOMATIC CALIBRATION SYSTEM FOR VIDEO DISPLAYS IN VISION TESTING

BACKGROUND OF THE INVENTION

1. Field of the Invention

This invention generally relates to methods for adjusting the brightness and contrast of video displays to obtain repeatable image quality. More specifically, the invention relates to procedures for calibrating a video display to obtain a known or desired light level in response to an input level. In particular the invention relates to a calibration procedure in which electronics for driving a raster-scan display is shared with electronics for measuring the light output level. Calibration is useful where pictoral data should be consistently displayed for evaluation or analysis, as is the case with stimuli for visual and psychological testing or X-ray, CAT or ultrasonic scanner pictures.

2. Description of the Prior Art (Prior Art Statement Under Rule 97)

Traditional approaches to calibrating raster-scan displays have involved external or internal photometers of varying degrees of complexity. But the photometers have operated independently of the electronics that generate the display test pattern. Photometers have, however, been built into the same housing as the display electronics. Typically the analog output of the photometer is converted to digital form and displayed numerically, with high precision requiring several digits of resolution. It is known that tests of vision must be conducted with calibrated video displays since clinically important differences in vision may be revealed by very small differences in display contrast.

SUMMARY OF THE INVENTION

The general aim of the invention is to provide a easy method and inexpensive apparatus for precision calibration of the brightness and contrast of a video monitor.

It is an object of the invention to reduce the complexity of a precision photometer for calibrating a numerically-driven video display by sharing the display driver electronics with the photometer electronics.

Another object of the invention is to eliminate the need for an analog-to-digital converter for processing the photometer signal in a precision photometer used for calibrating the brightness and contrast of a raster-scan display by making use of the raster scanning format of the display and improving accuracy by statistically averaging measurements over several vertical periods or display frame repetition intervals.

According to the present invention, a video monitor numerically-driven by a digital-to-analog (D/A) converter generating a video drive signal is provided with a photometer calibration circuit including a light sensor generating an analog photometer signal and a differential amplifier comparing the video drive signal to the analog photometer signal, thereby resulting in a difference signal precisely indicating the intensity calibration offset and contrast calibration offset of the video display. Since the difference signal is relatively independent of absolute intensity, fewer bits of information are required for representing the difference signal than the analog photometer signal to achieve the same precision in calibration and to correct for non-linearities in the response of the light sensor.

The need for an external analog-to-digital (A/D) converter to process the difference signal is eliminated entirely in the calibration of raster-scan video displays. Then a numeric indication of excess display intensity is obtained by the method of counting the number of horizontal scan lines per vertical period or display field for which the polarity of the difference signal indicates that the photometer signal exceeds the video drive signal, thereby relying on the fact that the intensity of the horizontal scan lines as seen by the light sensor drops off approximately as a linear function of the number of lines that are of increasing distance from the light sensor. The precision of the line count is further increased by averaging, preferably over an even number of frames, to take advantage of the increase in horizontal line resolution due to interlacing of adjacent frames.

Figure 1A:
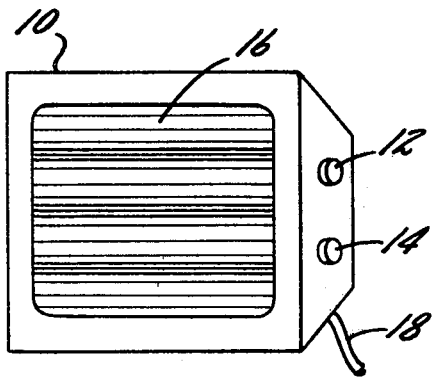
FIG. 1A illustrates a CRT monitor displaying a grating pattern affected by brightness and contrast control settings.

While the invention is susceptible of various modifications and alternative constructions, a certain preferred embodiment has been shown in the drawings and will be described below in considerable detail. It should be understood, however, that there is no intention to limit the invention to the specific form described but, on the contrary, the intention is to cover all modifications, alternative constructions and equivalents falling within the scope of the appended claims.

DESCRIPTION OF THE PREFERRED EMBODIMENT

Turning now to the drawings, FIG. 1 shows a cathode ray tube (CRT) monitor (10) having a brightness control (12) and a contrast control (14). The CRT face (16) displays a grating pattern of alternating light and dark bands. It is known that the brightness control (12) increases or decreases the intensity generally uniformly over the face (16) of the CRT, while the contrast control (14) enhances the variations in intensity.

Figure 1B:
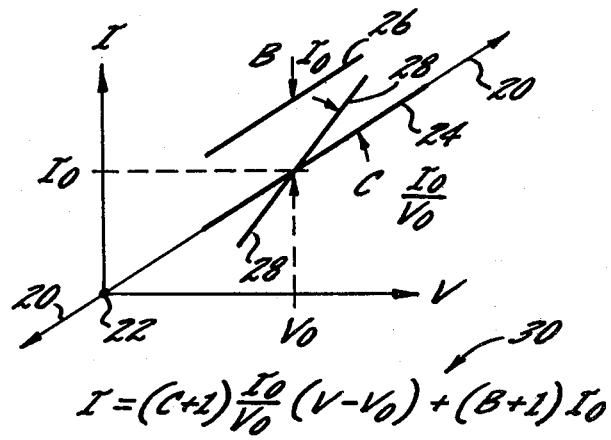
FIG. 1B illustrates the first-order approximation to the non-linear response of a CRT and defines brightness and contrast with respect to an operating point.

From a fundamental viewpoint, the CRT monitor (10) is a device for converting a video drive signal level (V) on an input cable (18) to an illumination level (I). In general, the CRT monitor (10) is a non-linear device but for precisely and uniformly displaying visual patterns a linear response with a fixed gain is desired. As shown in FIG. 1B, the function of intensity (I) in response to a video drive signal (V) should plot as a straight line (20) passing through the origin (22) with a given gain, or slope (Io/Vo). But with only two intensity adjustments on the CRT monitor (12), (14) the best approximation that can be achieved is a linear response in the vacinity of an operating point (Vo, Io) along a linear segment (24) of the (I) vs. (V) function. Adjustment of the brightness control (12) translates the segment upwardly and downwardly, for example, to an upward position (26) representing increased brightness. Adjustment of the contrast control (14), on the other hand, rotates the segment, for example, to a counter clockwise position (28) representing increased contrast.

In terms of numerical values, a relative brightness (B) and a relative contrast (C) may be defined in terms of a linear approximation for the function of intensity, generally designated (30) in FIG. 1B. Relative brightness is then a dimensionless constant proportional to the change in intensity from the operating point independent of the video signal level V, while relative contrast is a dimensionless constant proportional to the excess change in intensity due to a change in video signal level V. This definition correlates with the controls on a conventional television receiver, wherein the brightness control (12) adjusts the DC bias of the CRT, proportionally setting the DC-CRT current and thus intensity (I), while the contrast control (14) adjusts the gain of the video amplifier which applies a signal to the grid of the CRT, and thus adjusts the incremental change in CRT current, and thus intensity (I), in response to a change in the video input signal (V).

As defined in the equation (30) for intensity (I) as a function of the video drive input signal (V), the relative brightness (B) and contrast (C) are error values, and the problem of calibrating the video monitor (10) is analogous to solving the equation independently for (B) and (C). This requires two experimentally measured values of intensity $(I_1)$, $(I_2)$ in response to two different values of video drive input signal $(V_1)$, $(V_2)$, respectively.

Figure 1C:
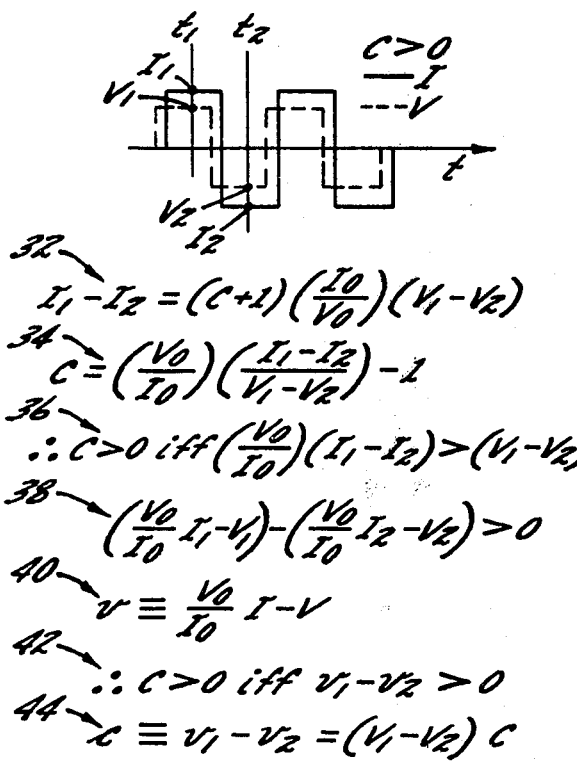
FIG. 1C illustrates that, to a first order approximation, contrast may be adjusted independently of brightness by measuring the difference in intensity between the light and dark regions of a grating pattern.
Figure 1D:
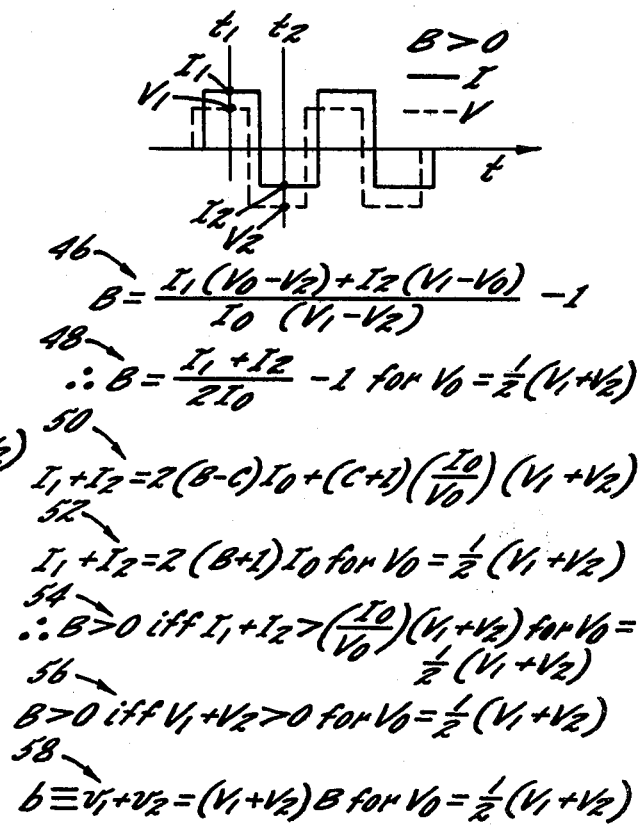
FIG. 1D illustrates that, to a first order approximation, brightness may be properly adjusted by measuring the sum of the intensities in the light and dark regions of a grating pattern.

(C) may be obtained independent of (B) merely by calculating the difference between the two experimentally measured values of intensity $(I_1)$, $(I_2)$, as shown in the equation generally designated (32) in FIG. 1C, and solving for (C) as in equation (34). Equation (34), however, is not particularly useful since it requires a division before a comparison to determine the sign of (C), which is needed to indicate the direction required to adjust the contrast control (14) to reduce (C) to zero. Equation (34) can be converted to the sign-indicating inequality (36) so that the sign of (C) is determined by a comparison. But equation (36) still requires substractions of intensity values $(I_1)$, $(I_2)$ obtained at different times $(t_1)$, $(t_2)$. To perform a numerical substraction requires the measured intensity (I) to be converted to a large number of binary bits, so that the error in the substraction is relatively small. This is a consequence of the fact that the contrast information is represented as the change in intensity, and is thus "located" in the less significant digits or bits. One solution to the problem would be to increase the contrast of the display image by increasing the difference in video drive signals $(V_1-V_2)$, but then the linear approximation for the (I) vs. (V) function would no longer hold, especially for inexpensive, nonlinear video monitors (10). In other words, the contrast and brightness controls (14,(12) would be improperly set for low contrast images. This is unsatisfactory for vision testing for contrast sensitivity since the test subject's psychological response to be tested is the ability to detect low contrast images.

A better solution is suggested by manipulating inequality (36) to inequality (38) and performing a change in variables as shown in definition (40) to arrive at the simplified inequality (42). Inequality (42) suggests equation (44) which may be verified by substitution of the new offset values $(v_1, v_2)$ as defined (40) into the equation (34) for (C), which suggests that contrast is more easily measured by the contrast offset (c), proportional to (C) via the difference in video drive signals $(V_1-V_2)$, as shown in equation 44.

Figure 2:
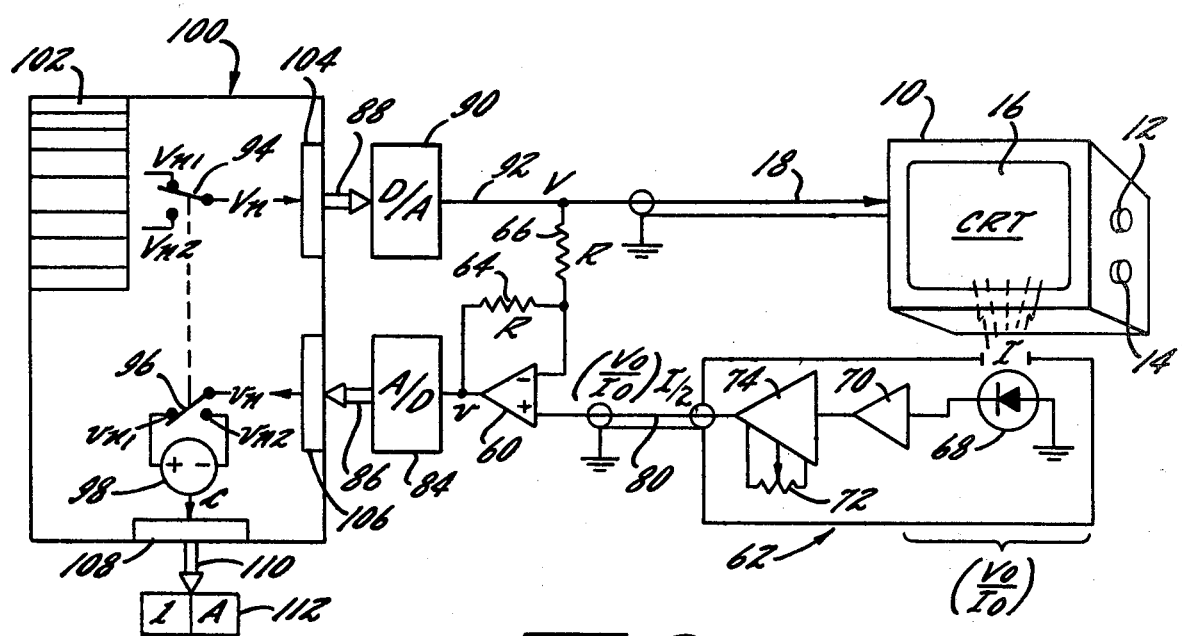
FIG. 2 illustrates a precision photometer calibration circuit for obtaining a numerical value of the error in intensity adjustment which can obtain increased precision in calibration even though a low resolution analog-to-digital (A/D) converter is used to obtain numerical values.

As shown in FIG. 2, the calculation of the new offset values $(v_1)$, $(v_2)$ as in equation (40) is easily performed on the analog signals (V) and ((Vo/Io)I) by a differential amplifier (60), the signal (Vo/Io) (I/2) being a voltage obtained from a photometer generally designated (62). Since the differential amplifier (60) is biased for unity negative gain and a positive gain of two by resistors (64), (66) of equal value (R), the output of the differential amplifier (60) directly indicates the offset value (v). The factor (Vo/Io) is set by the gain of the photometer (62) comprised of a light sensing photo-diode (68) for converting light intensity (I) transmitted by the face (16) of the monitor (10) to an electrical signal, a preamplifier (70), a gain-setting potentiometer (72) for adjustment of the magnitude of (Vo/2Io), and an amplifier (74) for driving the photometer signal cable (80).

Figure 3:
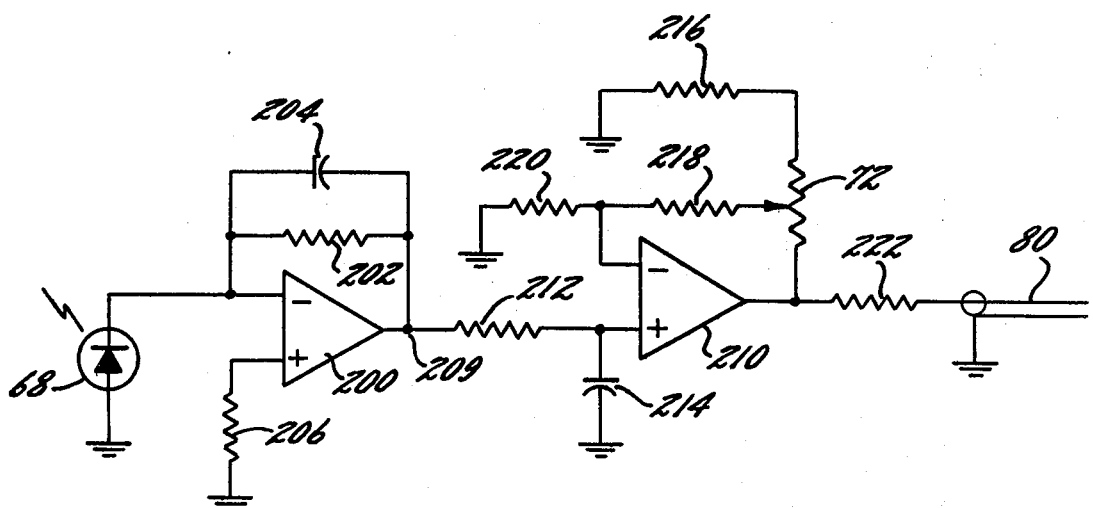
FIG. 3 is a schematic of the preferred circuit for the photometer.

The preferred embodiment for the photometer (62) is shown in FIG. 3. The photo-diode (68), part No. VTB 1013, is connected to a preamplifier (70) consisting of an operational amplifier (200), part No. 3140, a feedback resistor (202) and capacitor (204), nominally 2.00 megohms and 220 picofarads, respectively, and a bias input resistor (206), nominally 2 megohms. The preamplifier (70) in effect multiplies the short-circuit photocurrent of the photodiode (68) by the active load impedance of the feedback resistance (202) and capacitor (202) to generate a preamplified voltage output at the operational amplifier (200) output node (209). This preamplified voltage output is further amplified by an amplifier (74) comprising an operational amplifier (210), part No.

3140, an input filter resistor (212) and capacitor (214), nominally 1 megohm and 330 picofarads, respectively, and a gain-setting feedback network consisting of the gain adjusting potentiometer (72), a minimum gain-setting resistor (216), a feedback resistor (218), and a maximum gain-setting resistor (220). Nominal component values are 10 Kohms, 2.21 Kohms, 4.53 megohms, and 1.20 megohms, respectively. Finally, the output of the operational amplifier (210) is fed to the photometer output cable (80) via a source resistor (222), nominally 510 ohms.

The magnitude of the offset values $(v_1)$, $(v_2)$ can be made of the same order of magnitude as the contrast offset (c), and thus all digits or bits of the numerical value of the offset values $(v_1)$, $(v_2)$ will contain significant information and consequently a very inexpensive analog-to-digital converter (84) is needed for conversion of the offset value (v) from the output line (82) of the operational amplifier (60) to a useful numeric offset value $(v_n)$ on the digital output bus (86). The procedure is to set (V) to a desired operating point (Vo), for example, by setting a video drive number (Vn) on the input (88) of a digital-to-analog converter (D/A), (80) to the numerical value of (Vo), so that (Vo) appears on the output lead (92). Then, while observing the numeric value $(v_n)$ of the offset value (v), the brightness control (12) on the monitor (10) is adjusted to set $(v_n)$ as close as possible to zero. At this point $(V_n)$ is switched alternately to $(Vn_1)$ and $(Vn_2)$, by switching means (94), with $(Vn_1)$ and $(Vn_2)$ preferably equidistant above and below (Vo). Then the contrast control (14) may be adjusted while continuously calculating and observing $(c=v_1-v_2)$ to set the contrast offset (c) to zero. If the video amplifier in the monitor (10) is not a DC amplifier, the switching between $(Vn_1)$ and $(Vn_2)$ must occur at a rate too fast for (c) to be calculated manually. Preferably the switching is performed at the frame rate of the monitor (10) if the monitor is raster-scanned. To perform the calculations, a micro computer (100) is programmed via instructions in a memory (102) to put (Vn) on an output port (104) connected to the input (88) of the D/A converter (90) and to read $(v_n)$ on the output (86) of the A/D converter (84), via input port (106), alternately separate $(v_n)$ into $(v_{n1})$ and $(v_{n2})$ by operating switching means (96) and switching means (94) in synchronism, substract the following $(v_{n2})$ from the preceding $(v_{n1})$ with substractor means (98), and output the difference (c) on an output port (108) to an output bus (110) driving a numeric display (112).

It should be noted that if the video drive signal (V) was not available in analog form for an external substraction via the differential amplifier (60), then the number of bits of resolution for the A/D converter (84) would have to be increased to obtain similar resolution for the contrast offset (c) if $(v_n)$ was calculated by a numerical substraction of (Vn) from an analog-to-digital conversion of ((Vo/Io)I). This is a consequence of the fact that the most significant bit of $(v_n)$ can be smaller in magnitude than the least significant bit of (Vn). Choosing the most significant bit of $(v_n)$ to be one-half the magnitude of the least significant bit of $(v_n)$ permits the intensity (I) to be resolved to a number of bits equal to the sum of the D/A (90) resolution plus the A/D (84) resolution. For example, if the monitor (10) is turned off, the photometer (62) may then be used to measure ambient light intensity. (Vn) is sequenced from minus full scale to plus full scale until a $(v_n)$ greater than minus full scale is read; at this point, the concatenated binary number (Vn, $v_n$) is a numerical measure of light intensity with a bit resolution equal to the number of bits in (Vn) plus the number of bits in $(v_n)$.

Once the contrast control (14) of the monitor (10) is adjusted, one might expect that the calibration is finished since the brightness control (12) was adjusted before the contrast control (19). But for inexpensive, non-linear CRT monitors (10), the adjustment of brightness may have been disturbed by the non-linearity of the response function (I vs. V) due to switching between $(V_1)$ and $(V_2)$, and due to the change in the response function (I vs. V) itself due to the change in supply voltage levels in the monitor (10) induced by the physical adjustment of the contrast control (14). But the brightness control (12) may be adjusted for precisely the same switching between $(V_1)$ and $(V_2)$ that was used to adjust contrast control (14).

Returning to the linear mathematical model of FIG. 1B, the problem of adjusting brightness is analogous to solving equation (3) independently for (B). This may be done by substituting the equation for (C), (42), into equation (30) so that (C) is eliminated and then solving for (B), resulting in equation (46). This equation is not very useful, but for the case of $(Vo=\frac{1}{2}(V_1+V_2))$, which was the preferred selection for $(V_1)$ and $(V_2)$ to adjust contrast, equation (46) reduces to equation (48), which is similar in form to equation (34). Proceeding with a similar aim as in FIG. 1C, the sum of $(I_1+I_2)$, applying equation (30), is given by equation 50, which simplifies to equation (52) for the case of $(Vo=\frac{1}{2}(V_1+V_2))$. Equation (52) suggests the inequality (54) which in turn reduces, after the substitution for offset values $(v_1, v_2)$ as defined by equation (40), to equation (56), which in turn leads to the definition of an offset brightness (b) as the sum of the offset values $(v_1+v_2)$ which is proportional to (B) via the sum of the video drive signal $(V_1+V_2)$, as shown in equation (58). The practical significance of this is that the brightness control (12) may be adjusted using the same circuits and procedure as the above-described adjustment of the contrast control (14) merely by using an adder in place of the subtractor (98).

After the brightness control (12) is adjusted, the contrast may be re-checked by replacing the adder with the substractor (98) and reading the value of the contrast offset (c) off the hexadecimal display (112). The contrast control, and then the bightness control (12) may be readjusted if necessary to converge toward simultaneous adjustment. In practice the procedure is terminated when sufficiently small values of (c) and (b) are obtained.

It should be noted that once the contrast and brightness are adjusted for a variation between $(V_1)$ and $(V_2)$, they are in excellent adjustment for other video drive signals (V) alternating between $(V_1)$ and $(V_2)$ with the same average value even though the frequency with which the video drive signal (V) shifts between $(V_1)$ and $(V_2)$ may change. This is a consequence of the fact that the (V) vs. (I) response of the monitor (10) has been linearized for the two points $(V_1, I_1)$ and $(V_2, I_2)$ and the (V) vs. (I) response, even for inexpensive CRT monitors (10), will not significantly change if the DC bias levels in the monitor's video amplifier and CRT bias circuits do not change. Similarly, the contrast and brightness are in good adjustment for video signals (V) having the same average, or DC value even though the difference $(V_1-V_2)$ may change.

It should be noted further that if the operating point $(Vo=\frac{1}{2}(V_1+V_2))$ is changed, after adjustment, to a new operating point by changing the video dive levels (Vn$_1$, Vn$_2$) the calibration offsets (b), (c) will be slightly less or greater than zero. Rather than recalibrating to the new operating point, the offsets at least may be measured to characterize the second and higher order non-linearities of the CRT monitor if the offsets are not too large. Some of the higher order non-linearities, for example, are due to the photometer (62) itself, and this portion may be subtracted out. The portion due to photometer (62) non-linearities is determined experimentally by comparing the concatenated measured light intensity number (Vn, Vn) to the intensity measured by a calibrated, high-precision laboratory photometer and calculating the difference in readings.

Figure 5:
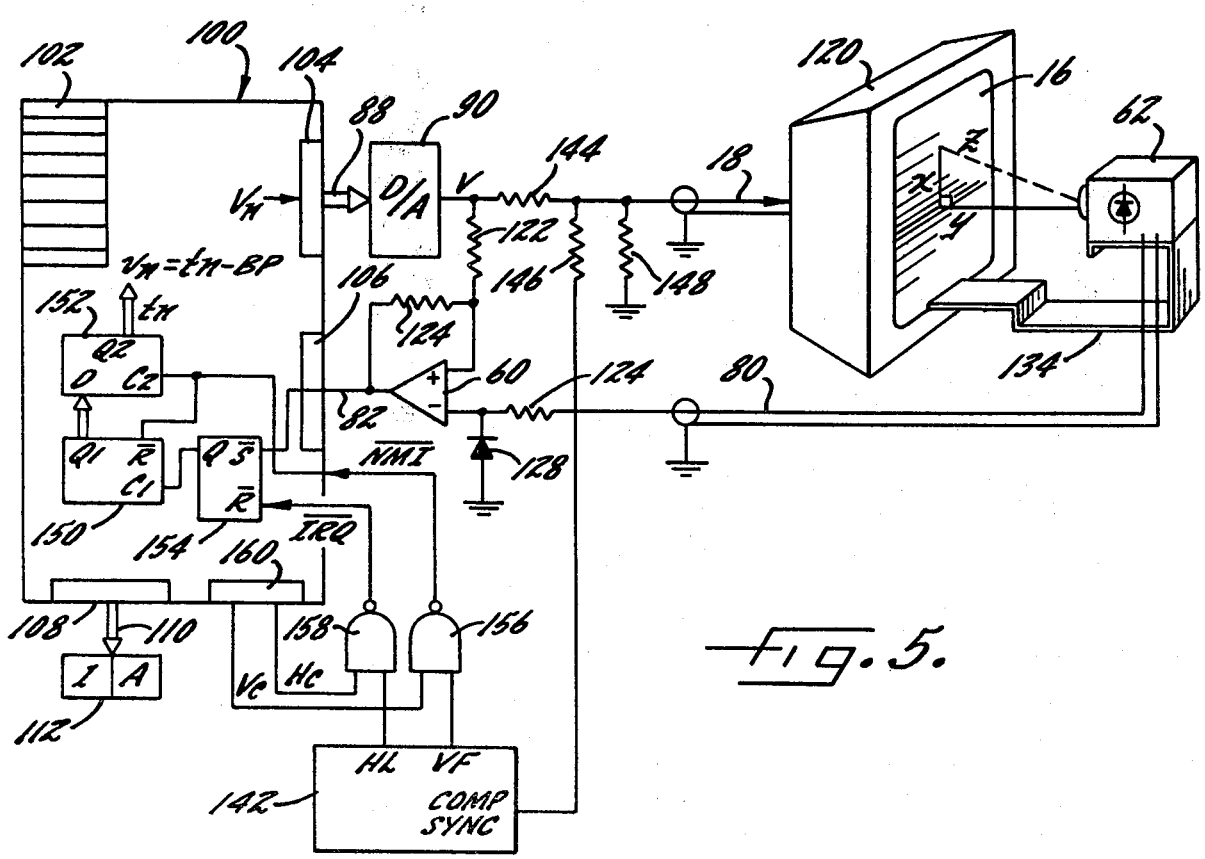
FIG. 5 illustrates a precision photometer calibration circuit for obtaining a numerical value of the error in intensity adjustment which employs the method of counting the number of scan lines for which received intensity per line exceeds a predetermined threshold.

The circuitry for the calibration circuit in FIG. 2 may be further simplified to the circuit of FIG. 5 if a raster-scanned CRT monitor (120) is used. Then the gain of the differential amplifier (60) may be increased to implement a comparator to generate a two-level quantized, or binary digital signal, that may be fed directly to the microcomputer. To increase the gain of the differential amplifier (60) still further, positive feedback may be employed by the Schmitt trigger configuration including a series resistor (122) connecting the video drive (V) to the positive (+) input of the differential amplifier (60) and a feedback resistor (124) connecting the output line (82) to the positive (+) input. Representative component values are 6.8 Kohms and 10 Mohms, respectively. To protect the negative (−) input of the differential amplifier (60) from transients on the photometer output cable (80), the preferred embodiment also includes a series current limiting resistor (124), nominally 6.8 Kohms, and a transient suppression diode (128).

Figure 4A:
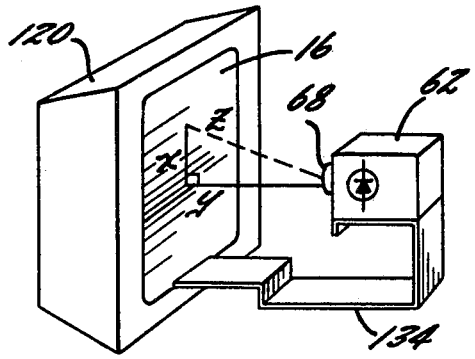
FIG. 4A illustrates the alignment of the photodiode in the photometer for counting horizontal scan lines to measure display intensity.

The microcomputer (100) may convert the binary output (82) of the comparator to a multi-level digital or numeric representation by numerically averaging the binary output (82) for various raster-scan lines. As shown in FIG. 4A, the photometer (62) has its photodiode (68) aimed at the center of the CRT face (16). The photometer (62) is supported on a stand (134) which insures that the photodiode (68) is a fixed distance (y) from the CRT face (16) and is in general centrally aimed. Assuming that the photodiode (68) receives light equally well from all angles and further assuming that all scan lines on the CRT face (16) have uniform brightness then the received light intensity (I) when the scanning spot is halfway across the face (16) is inversely proportional to the square of the distance (z) from a given horizontal scan line at a vertical height (x) from the center, as illustrated by the equation generally designated (136). Equation (136) may be converted to a dimensionless function (f) of a dimensionless variable (u) to generally describe the variation in received light intensity in terms of the maximum intensity (Imax) occuring for the scan line at (x=o), as shown in the equation generally designated (138) in FIG. 4B. Equation (138) is also graphically plotted in FIG. 4B, generally designated (140), revealing that intensity (I(x)) is an approximately linear function of (x) for (x=¼y) to (x=y). In practice the photodiode (68) does not respond equally to light from all angular directions, and the graphical plot (140) further reveals that if the photodiode (68) response rolls off for (x>y), or angles greater than 45° off the photodiode (68) axis of maximum directivity, the intensity response (I(x)) will become even more linear for (x>y).

Figure 4B:
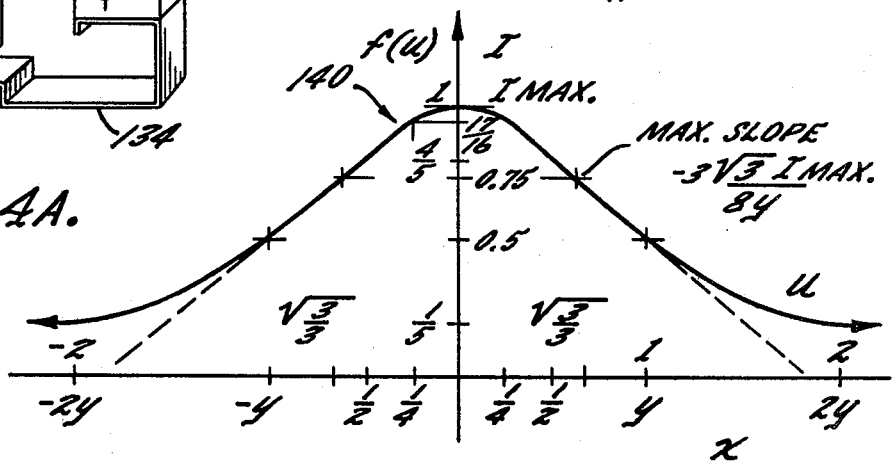
FIG. 4B is a graph of the received intensity per scan line as a function of scan line vertical position.

The significance of the graph (140) in FIG. 4B is that if a threshold intensity (Ith) is set less than the intensity (Imax) registered by the scan line at (x=0), then the intensity of the entire display is a fixed percentage of (Imax) and is proportional to the number of lines (N) for which the measured intensity (I) exceeds the threshold intensity (Ith), since the number of lines (N) for a given distance (x) is fixed. For the circuit of FIG. 5, the threshold intensity is V(Io/Vo), and thus the threshold intensity (Ith) may be adjusted by varying the video drive number (Vn) until a number of lines (N) is counted within a distance (x) from the center at (x=0) so that (x) falls within a linear range of (I(x)), for example, within (x=¼y) to (x=y).

The number of lines (N) may be counted by measuring the number of transitions on the comparator output line (82) since the maximum measured intensity for each line occurs when the scanning spot is halfway across the CRT face (16) and a pronounced minimum occurs when the retrace is blanked; thus if the measured intensity (I) exceeds the threshold (Ith), a single pulse with one rising transition and one falling transition per line is generated, and if the threshold is never exceeded, there is no pulse. The transition, may be counted by a binary ripple counter (150) to register the number of lines with an intensity (I) exceeding the threshold (Ith).

As shown in FIG. 5, the scanning of the CRT monitor (120) is synchronized to the output (COMP SYNC) of a raster generator (142). The synchronization output (COMP SYNC) is added to the video drive (V) by summing resistors (144), (146) and a load resistor (148). Representative values are 470 ohms, 220 ohms and 150 ohms, respectively. The raster generator, which may be an integrated circuit such as National Semiconductor part No. MM5320 or a CRT controller IC such as Motorola part No. MC6845 used in conjunction with a composite synchronization (COMP SYNC) generating circuit also provides separate horizontal line (HL) and vertical frame (VF) outputs providing individual synchronization (sync) pulses. These pulses are used for further control of the counting of scan lines for which the measured intensity (I) exceeds the threshold intensity (Ith). If a binary ripple counter (150) is used, for example, the vertical frame sync pulse (VF) can be applied to a reset pin (R) to reset the counter (150) at the beginning of the frame, and the total number of counts may be obtained at the end of the frame by latching the counter outputs (Q1) received by latch inputs (D) using a latch (152) clocked via falling edge-sensitive clock input (C2) receiving the vertical pulse (V). Then the total number of counts (tn), indicating the voltage offset (v$_n$), appears on the latch outputs (Q2).

Improved results may also be obtained by using the horizontal information provided by the raster generator (142) horizontal pulse (HL). Only one count per scan line, for example, should be counted since any more than one count must indicate "noise" rather than "signal". For this purpose a set-reset flip-flop (154) has a set input ($\overline{S}$), asserted low, receiving comparator output on line (82), thus the flip-flop (154) is set when the measured intensity (I) exceeds the threshold (Ith), and a reset input ($\overline{R}$) asserted low, activated by the horizontal line sync pulse (HL), so that the flip-flop is reset, and generates a high-to-low signal on the output (Q) upon the occurrence of the horizontal line sync pulse (HL) if the flip-flop (154) was reset since the previous horizontal sync pulse. The falling-edge sensitive clock (C1) of the binary ripple counter (150), then, receives the flip-flop (154) output (Q) to count the number of line scans for having an intensity (I) exceeding the threshold (Ith)

regardless of the number of times per line the threshold (Ith) is exceeded.

It should be noted that the flip-flop (154), counting (150), latching (152), switching (94), (96) and comparison functions (98) are preferably performed by a microcomputer (100) executing a series of instructions in memory (102). Since these functions are synchronized to the vertical frame sync pulses (VF) and the flip-flop function is synchronized to the horizontal line sync pulses (HL), it is desirable to "interrupt" the microprocessor by using the horizontal line sync pulses (HL) to activate the "maskable" interrupt via maskable interrupt input ($\overline{IRQ}$) and by using the vertical frame sync pulses (VF) to activate the "non-maskable" interrupt via the non-maskable interrupt input ($\overline{NMI}$) as they typically appear on a microprocessor integrated circuit such as Motorola part No. MC6800. To deactivate the interrupt inputs at any time, NAND gates (156), (158) are provided with gating signals (HC), (VC) from a microcomputer output port (160) to turn off the horizontal ($\overline{IRQ}$) and vertical ($\overline{NMI}$) interrupts respectively. Software, then, consists of three levels. A main program includes a subroutine (SAMPLE) that initializes flags and variables and performs highly repetitive tasks such as sampling the comparator output line (82), and if the sampled logic state indicates that the intensity threshold (Ith) is exceeded, a flip-flop flag (FF) is set. A horizontal interrupt routine (HORIZONTAL), upon the occurrence of the horizontal line sync pulse (HL), increments a counter variable (COUNT) if the flip-flop flag (FF) has been set, and then reset the flag (FF). The horizontal interrupt routine starts at the address (HORIZONTAL) pointed to by the interrupt vector activated by the horizontal interrupt input ($\overline{IRQ}$). A vertical interrupt routine (VERTICAL), upon the occurrence of a vertical frame sync pulse (VF), signals the start of a new frame via a flag (START), latches the contents of the counter variable (COUNT) into a storage register (TOTAL), resets the counter (COUNT), and linearizes the measure of intensity by substracting a bias point number (BP) to arrive at the voltage offset number ($v_n$=VOFF). The bias point number (BP) should be the number of horizontal lines within about twice five-eights of the distance (y) from the CRT face (16) to the photodiode (68) so that a reading of zero for ($v_n$) corresponds to the middle of the linear region on the graph (140) in FIG. 4B. Finally, the vertical interrupt routine (VERTICAL) sets a flag (FINISHED) indicating that a new measure of intensity (VOFF) has been determined. Additionally, the vertical interrupt routine (VERTICAL) may use a temporary storage register (AVERAGE) to average over at least two frame intervals to reduce noise error, preferably over an even number to achieve increased resolution due to frame interlacing. The vertical interrupt routine (VERTICAL) may also perform switching (94) of video drive levels (Vn=VN) and the detection of alternate offset values ($v_1$=VOFF1), ($v_2$=VOFF2) and computation of the brightness (b=BOFF) and contrast (c=COFF) offsets. A representative microcomputer procedure is shown in Table 1 following the specification, conforming to the microcomputer (100) functions depicted in FIG. 2 and FIG. 5.

In one variation of the preferred embodiment adapted to calibrate a raster-scanned monitor (120) to display sinusoidal gratings for contrast sensitivity vision testing, a single calibration adjustment is performed for ten video modulation amplitude levels corresponding to a difference in video drive ($V_1$-$V_2$) equal to 60 hex to F0 hex in steps of 10 hex. The procedure is illustrated in flow charts of the executive program of FIG. 6A, the user instruction subroutine of FIG. 6B, the sampling subroutine (SCAN) of FIG. 6C, the frame interrupt routine of FIG. 6D, and the line interrupt routine of FIG. 6E. Lower video modulation levels are not weighted in the calibration procedure since departures from linearity occur at low modulation levels due to a variety of factors including phosphor extinction and ambient light. It is assumed that these extraneous factors can be controlled or are characteristic of the monitor so that calibration at high modulation levels still gives uniform and repeatable results for low modulation levels.

Figure 6A:
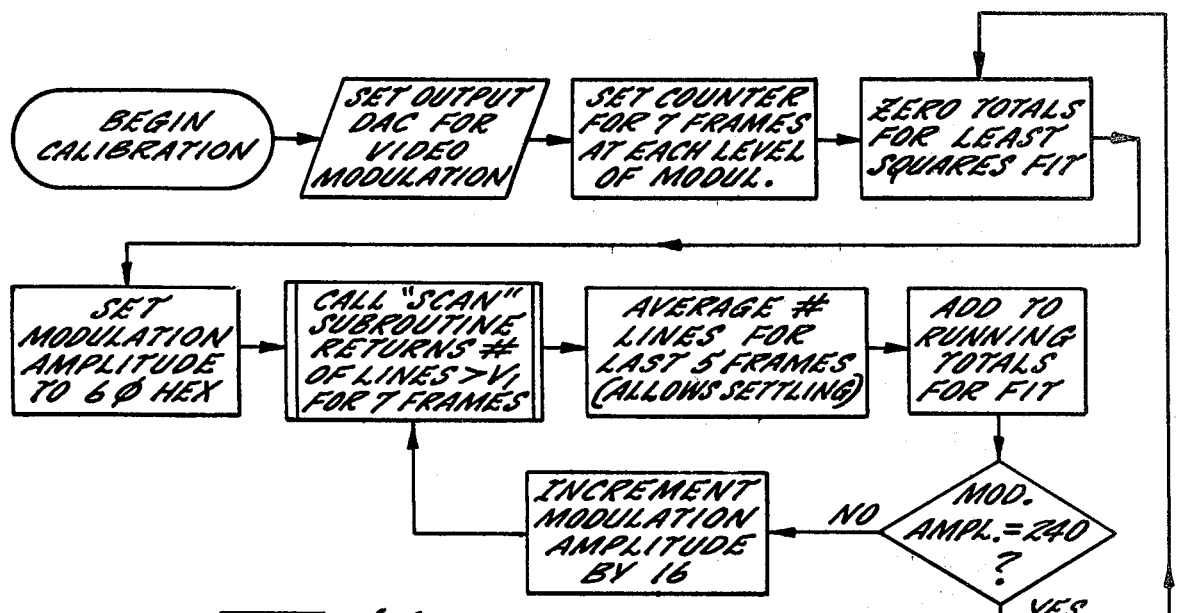
FIG. 6A is a flowchart illustrating an executive program using a least-squares statistical algorithm to obtain a best-fit single intensity calibration over a plurality of video modulation amplitudes.
Figure 6B:
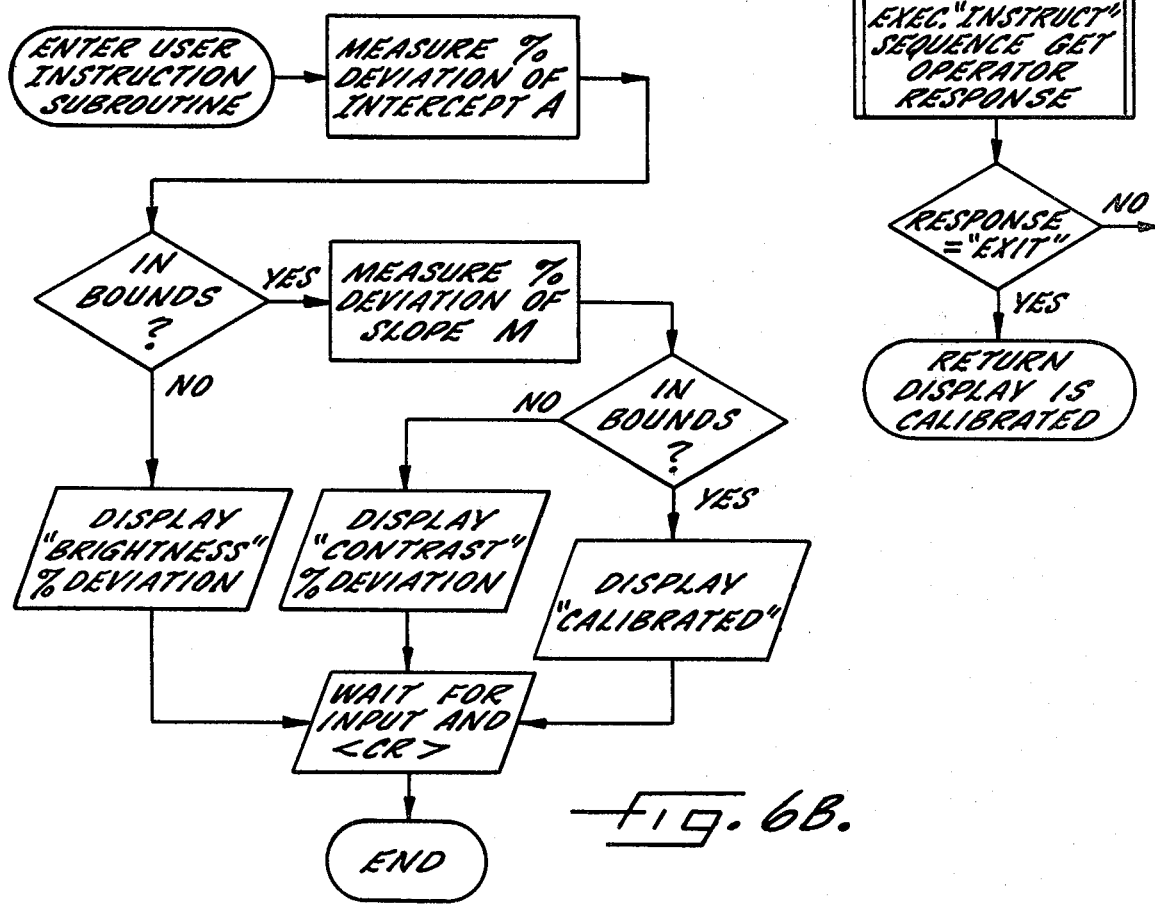
FIG. 6B is a flowchart of a subroutine called by the executive program for instructing the instrument operator on how to adjust the brightness and contrast controls of the CRT monitor for proper calibration.
Figure 6C:
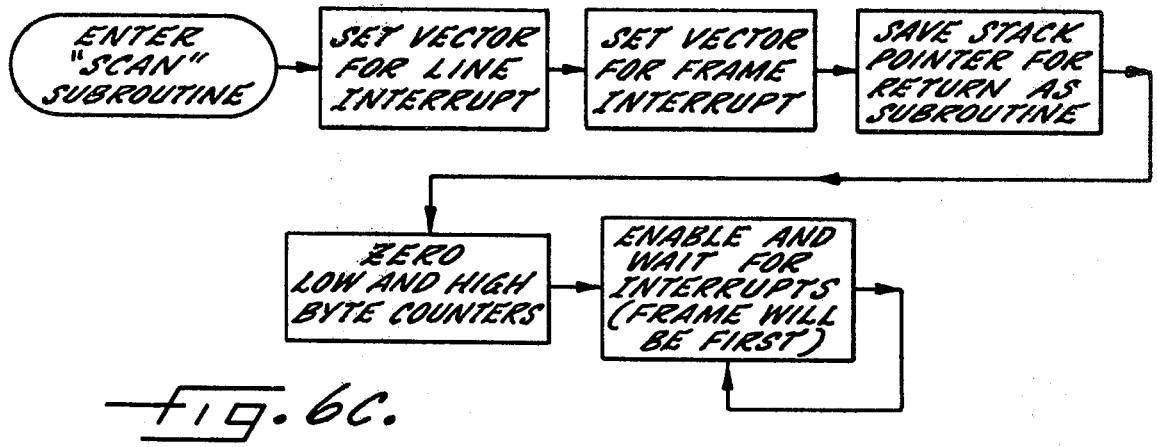
FIG. 6C is a flowchart of a subroutine called by the executive program to count the number of scan lines having a brightness which exceeds the video signal reference level for frames at the maximum video intensity during frame-by-frame video modulation.
Figure 6D:
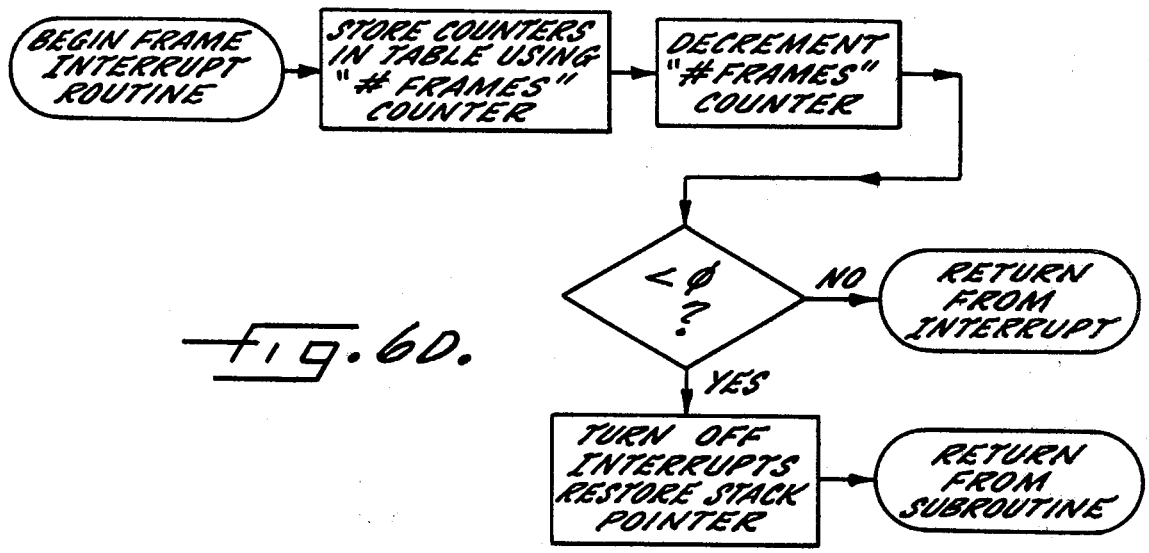
FIG. 6D is a flowchart of the frame interrupt routine that continues the scan line counting procedure over a number of frames.
Figure 6E:
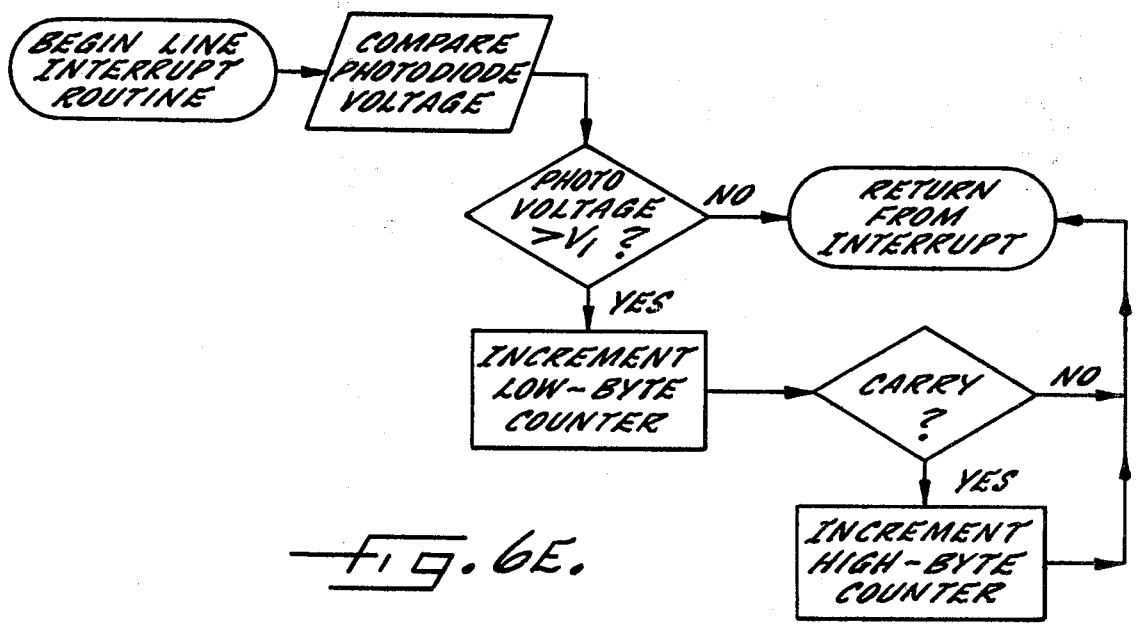
FIG. 6E is a flowchart of the line interrupt routine that performs the individual line brightness comparisons and line counting.

In the executive program of FIG. 6A, the video drive number (Vn) is modulated between ($V_1$) and ($V_2$) during alternate frames. When the video drive (V) is at the maximum ($V_1$), the number of horizontal scan lines (tn) for which the photovoltage ((Vo)/Io)I) exceeds the video drive (V) is counted in a two-byte counter. The totals for the first two frames at ($V_1$) are ignored, however, so that the bias point in the monitor's (120) video amplifier may stabilize. The totals for the next five frames at ($V_1$) are averaged, resulting in an ordinate data point Y for the modulation amplitude level ($V_1$-$V_2$)=X treated as an abscissa data point. The video modulation is then increased to the next step and a new data point (X,Y) is obtained by the same procedure.

After the ten data points are obtained a "least squares" mathematical algorithm calculates the best estimate of the slope (M) and ordinate intercept (A). The least squares algorithm uses running totals of (Y) and (X Y), while running totals of (X) and ($X^2$) are predetermined constants, to calculate (M) and (A) using the number of points (N) equal to ten:

$$M = \frac{\sigma_{xy}}{\sigma_{x2}} = \frac{N \sum_{i=1}^{N} X_i Y_i - \sum_{i=1}^{N} X_i \sum_{i=1}^{N} Y_i}{N \sum_{i=1}^{N} X_i^2 - \left(\sum_{i=1}^{N} X_i\right)^2}$$

$$A = \overline{Y} - M\overline{X} = \frac{\sum_{i=1}^{N} Y_i}{N} - M \frac{\sum_{i=1}^{N} X_i}{N}$$

The slope (M) corresponds to the contrast offset (c=v1−v2) and the difference between the ordinate intercept (A) and the bias point (BP) corresponds to the brightness offset (b=v1+v2). In other words, when the controls (12, 14) are properly adjusted the number of lines (tn) counted should equal the bias point (BP) regardless of the modulation level. If the line count is consistently too high, the brightness control (12) must be decreased. If the line count increases with increasing modulation level, the contrast control (14) must be decreased.

For a particular raster-scanned monitor (120) the magnitudes of the slope (M) and difference between the ordinate intercept (A) and the bias point (BP) are proportional by a predetermined factor to the percentage deviations of the contrast (14) and brightness (12) control settings required for proper adjustment. In the (INSTRUCT SEQUENCE) subroutine of FIG. 5E, predetermined constants of proportionality are used to calculate the percentage deviations, and the signs of the slope (M) and difference (A-BP) are used to indicate the direction of control adjustment to the instrument operator.

TABLE 1
MICROCOMPUTER PROCEDURE STEPS

| | | |
|---|---|---|
| | | SAMPLE SUBROUTINE |
| SAMPLE | FF ← 0 | Initialize flip-flop (154). |
| | START ← 0 | Clear start flag used by vertical interrupt routine. |
| | VC ← 1 | Turn on vertical and horizontal |
| | HC ← 1 | interrupts by enabling gates |
| | OUT 160 ← (VC,HC) | (158) and (156). |
| | WRITE (OUT 160) | |
| | FINISHED ← 0 | Set finished flag to zero. |
| WAIT | IF (START.EQ.0) GO TO WAIT | Wait until first vertical interrupt sets start flag. |
| CONT | READ (INPUT 106) | Sample comparator output line 82 |
| | IF (INPUT 106.EQ.0) FF ← 1 | by reading input port (106) and set FF if line 82 is a logical 0. |
| | IF (FINISHED.EQ.0) GO TO CONT | Continuously sample the comparator until end of vertical interrupt procedures. |
| | RETURN | |
| | ... | |
| | | HORIZONTAL INTERRUPT |
| HORIZONTAL | IF (FF.EQ.0) RETURN | Return if FF has not been set. |
| | COUNT ← COUNT + 1 | Otherwise the intensity threshold has been exceeded, so increment the counter and reset FF. |
| | FF ← 0 | |
| | RETURN | |
| | ... | |
| | | VERTICAL INTERRUPT |
| VERTICAL | IF (START.EQ.1) GO TO RUN | On first interrupt |
| | START ← 1 | set start flag, |
| | COUNT ← 0 | zero counter, |
| | AVERAGE ← 0 | zero average accumulator, |
| | FRAME ← 1 | start horizontal line counting for frame 1, |
| | SWITCH ← 1 | switch position 1, and |
| | VN ← VN1 | video drive to VN1. |
| | OUT 104 ← VN | |
| | WRITE (OUT 104) | |
| | RETURN | |
| RUN | TOTAL ← COUNT | AT end of a frame, latch COUNT into TOTAL, |
| | COUNT ← 0 | reset COUNT, |
| | TOTAL ← TOTAL-BP | substract bias point. |
| | IF (FRAME.EQ.2) GO TO TOGGLE | Check if average is complete. If not, |
| | FRAME ← FRAME + 1 | increment FRAME, and |
| | AVERAGE ← AVERAGE + TOTAL | average in the TOTAL and |
| | RETURN | RETURN. |
| TOGGLE | FRAME ← 1 | If average is complete, set FRAME back to 1 and find |
| | IF(SWITCH.EQ.2) GO TO POS 2 | the current switch position. |
| POS 1 | SWITCH ← 2 | Toggle switch to position 2. |
| | VOFF1 ← AVERAGE + TOTAL | Compute first voltage offset VOFF 1. |
| | VN ← VN2 | Change video drive VN from |
| | OUT 104 ← VN | VN1 to VN2. |
| | WRITE (OUT 104) | |
| | RETURN | |
| POS 2 | SWITCH ← 1 | Toggle switch back to position 1. |
| | VOFF2 ← AVERAGE + TOTAL | Compute second voltage offset VOFF 2. |
| | VN ← VN1 | Change video drive VN from |
| | OUT 104 ← VN | VN2 to VN1 |
| | WRITE (OUT 104) | |
| FINISH | FINISHED ← 1 | Set FINISHED flag to activate a SAMPLE subroutine return. |
| | VC ← 0 | Turn off horizontal and vertical |
| | HC ← 0 | interrupts. |
| | OUT 160 ← (VC,HC) | |
| | WRITE (OUT 160) | |
| | IF (CONTRAST) GO TO CONTRA | Check if brightness or contrast adjustment is desired. |
| BRIGHT | BOFF ← VOFF1 + VOFF2 | Compute brightness offset |
| | OUT 108 ← BOFF | BOFF as the sum of voltage offsets and output the |
| | WRITE (OUT 108) | brightness offset to the |
| | RETURN | hexadecimal indicator (112). |
| CONTRA | COFF ← VOFF1 − VOFF2 | Computer contrast offset COFF as difference of vol- |

| TABLE 1-continued | |
|---|---|
| MICROCOMPUTER PROCEDURE STEPS | |
| OUT 108 ← COFF<br>WRITE (OUT 108)<br>RETURN | tage offsets and output contrast offset to the hexadecimal indicator (112). |

We claim:

1. A calibration circuit for indicating the error in intensity adjustment of a video display driven by video drive signal comprising, in combination:

light sensor means generating a photometer signal in response to illumination from the video display;

comparator means comparing the photometer signal to the video drive signal for generating an error signal indicative of the error in intensity adjustment of the video display, said comparator means comprising differential amplifier means having an output signal proportional to a difference between the video drive signal and the photometer signal;

digital to analog converter means having a digital control signal input and an analog output generating the video drive signal in response to the logic states on the digital control signal input, and having a response time at least as short as the low frequency response time of the video display to the video drive signal; and digital sampling means for intermittently sampling and storing a digital representation of the comparator means output signal, and having a sampling response time at least as short as the low-frequency response time of the video display to the video drive signal, so that the difference between sampled and stored comparator output signals in response to alternating logic states on the digital control signal input indicates the error in the contrast adjustment of the video display, and the sum of the sampled and stored comparator output signals in response to alternating logic states on the digital control signal input indicates the error in the brightness adjustment of the video display.

2. The calibration circuit as claimed in claim 1 further comprising:

a raster scan generator for controlling the generation of line scans across the face of the video display, scanning a plurality of lines over the face of the display periodically and having a frame sync output generating a frame sync pulse indicating the completion of a frame scan over the face of the display, and counting means responsive to the number of times the comparator output error signal changes polarity between vertical sync pulses, so that the total is responsive to the number of scan lines per frame for which the photometer signal exceeds the video drive signal, thus indicating the intensity of light emitted from the face of the display.

3. The calibration circuit as claimed in claim 2 wherein the comparator is a Schmitt trigger so that transitions due to noise are suppressed.

4. The calibration circuit as claimed in claim 2 wherein:

the raster scan generator has a line sync output generating a line sync pulse indicating the completion of individual line scans, and the counting means has an enable input accepting the line sync pulses for enabling the counting of no more than one count after each line sync pulse.

5. The calibration circuit of claim 4 wherein the counting means further comprises:

a flip-flop having a set input accepting the comparator output and a reset input accepting the line sync pulses, and a binary counter with an input accepting the flip-flop output and responsive to flip-flop output transitions, and a reset input accepting the frame sync pulse for resetting the binary counter upon the occurrence of the frame sync pulse, and a latch register having a data input accepting the binary counter output and having a clock input accepting the frame sync pulse for latching the counter output before the counter is reset, so that the number of scan lines per frame for which the photometer signal exceeds the video drive signal is stored in the latch.

6. A circuit for numerically measuring the light intensity of a raster-scan display having a frame sync output generating a frame sync pulse indicating the completion of a scan over the face of the display comprising, in combination:

(a) a light sensor generating a photometer signal indicating the light transmitted by the display to a localized area in front of the display, and (b) a comparator having an input receiving the photometer signal and having a logic output indicating whether the photometer signal exceeds a preset threshold level, and (c) a counter having an input receiving the comparator logic output signal and responsive to the number of times the logic output signal changes its logic state, and (d) indicating means for indicating the counter value after the occurrence of a frame sync pulse, so that the number of scan lines having an observed light intensity at the light sensor exceeding a preset threshold is indicated, thus providing a numeric value of the light intensity of the display.

7. The circuit as claimed in claim 6 wherein the comparator is a Schmitt trigger so that transitions due to noise are suppressed.

8. A circuit for numerically measuring the light intensity of a raster-scan display having a line sync output and a frame sync output indicating the occurrence of a line scan and a frame scan respectively, comprising, in combination:

(a) a light sensor generating a photometer signal indicating the light transmitted by the display to a localized area in front of the display, and (b) a comparator having an input receiving the photometer signal and a logic output indicating whether the photometer signal exceeds a preset threshold level, and (c) a counter having a counter input receiving the line sync signal and an enable input receiving the comparator logic output signal, the counter being responsive to logic transitions on the counter input if a logic state is asserted on the enable input between logic transitions on the counter input, and (d) indicating means for indicating the counter value after the occurrence of a frame sync pulse, so that the number of scan lines having an observed light intensity at a localized area in front of the display exceeding a preset threshold is indicated, thus providing a numeric value of the light intensity of the display.

9. The circuit as claimed in claim 8 wherein the counter comprises:
- a flip-flop having a set input and a reset input, the set input receiving the comparator logic output signal and the reset input receiving the line sync pulses, and
- a binary counter with an input accepting the flip-flop output and responsive to flip-flop output transitions.

10. The circuit as claimed in claim 9 wherein the binary counter has a reset input for resetting the counter to a predetermined state, accepting the frame sync pulses.

11. The circuit as claimed in claim 10 wherein the indicating means further comprises a latch register having an input accepting the counter value and clocked by the leading transition of the frame sync pulse so that the latch register indicates the number of scan lines having an observed light intensity at a localized area in front of the display exceeding a preset threshold during a preceding frame scan, thus providing a numeric value of the light intensity of the display.

12. The method of numerically measuring the intensity of a raster-scanned display comprising the steps of:
(a) measuring the intensity of illumination transmitted to a localized area in front of the display during a plurality of line scan intervals, and
(b) comparing the measured intensity of illumination to a preset threshold, and
(c) quantizing the results of the comparisons to a fixed number of discrete levels, and
(d) numerically averaging the results of the quantization, so that the average value numerically indicates the overall intensity of the display.

13. The method of claim 12 wherein the measuring of intensity is performed during a plurality of line scan intervals within the same frame.

14. The method of claim 13 in which the results of the comparisons are quantized to two levels, so that a single binary value indicates whether the measured intensity exceeds the preset threshold.

15. The method of claim 14 in which the averaging is performed by counting the number of line scan intervals during which the measured intensity of illumination exceeds the preset threshold, so that the total is approximately proportional to the overall intensity of the display.

16. The method of claim 15 wherein the counting of the number of line scan intervals is performed over a number of frames, so that noise is reduced.

17. The method of claim 16 wherein the number of frame is an even number so that resolution for interlaced raster-scanned displays is increased.

* * * * *